US010281549B2

(12) United States Patent
Takeshima

(10) Patent No.: US 10,281,549 B2
(45) Date of Patent: May 7, 2019

(54) MAGNETIC RESONANCE IMAGING APPARATUS AND IMAGE PROCESSING APPARATUS

(71) Applicant: TOSHIBA MEDICAL SYSTEMS CORPORATION, Otawara-shi, Tochigi (JP)

(72) Inventor: Hidenori Takeshima, Kanagawa (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 750 days.

(21) Appl. No.: 14/666,531

(22) Filed: Mar. 24, 2015

(65) Prior Publication Data

US 2015/0276908 A1 Oct. 1, 2015

(30) Foreign Application Priority Data

Mar. 25, 2014 (JP) ................................. 2014-062701

(51) Int. Cl.
*G01R 33/561* (2006.01)
*G01R 33/48* (2006.01)
*G01R 33/385* (2006.01)
*G01R 33/34* (2006.01)
*G01R 33/383* (2006.01)
*G01R 33/30* (2006.01)

(52) U.S. Cl.
CPC ................................ *G01R 33/5611* (2013.01)

(58) Field of Classification Search
CPC .................... G01R 33/5611; G01R 33/4818
USPC .................................................. 324/307–309
See application file for complete search history.

(56) References Cited

U.S. PATENT DOCUMENTS 6,876,201 B2  4/2005 Takizawa et al.
6,919,722 B2  7/2005 Angelos et al.
(Continued)

FOREIGN PATENT DOCUMENTS

JP   2008-005943 A   1/2008

OTHER PUBLICATIONS

K.P. Pruessmann et al., "SENSE: Sensitivity Encoding for Fast MRI", Magnetic Resonance in Medicine 42, 1999, pp. 952-962.
(Continued)

*Primary Examiner* — Rishi R Patel
(74) *Attorney, Agent, or Firm* — Nixon & Vanderhye P.C.

(57) ABSTRACT

A magnetic resonance imaging apparatus according to an embodiment includes a collector, a transformation module, an unfolding module and an inverse transformation module. The collector collects time-series k-space data of a plurality of channels while spatially changing a sampling position. The transformation module obtains transformed space data of the respective channels by applying, to the time-series k-space data of the respect channels, Fourier transform on a spatial axis and certain transformation on a temporal axis. The unfolding module eliminates a signal point on a basis of a certain criterion and performs unfolding using the transformed space data on the respective channels and sensitivity distribution information on the respective channels; and the inverse transformation module applies inverse transformation of the certain transformation on the temporal axis to an unfolded data on which the signal point has been eliminated and the unfolding has been performed.

7 Claims, 6 Drawing Sheets

(56) References Cited

U.S. PATENT DOCUMENTS

| | | | |
|---|---|---|---|
| 6,965,232 B2 | 11/2005 | Sodickson | |
| 7,592,809 B1* | 9/2009 | King | G01R 33/5611 324/307 |
| 2010/0117647 A1* | 5/2010 | Madore | G01R 33/561 324/310 |
| 2015/0028872 A1* | 1/2015 | Takeshima | G01R 33/5611 324/318 |

OTHER PUBLICATIONS

J. Tsao et al., "k-t BLAST and k-t SENSE: Dynamic MRI With High Frame Rate Exploiting Spatiotemporal Correlations", Magnetic Resonance in Medicine 50, 2003, pp. 1031-1042.

Japanese office action dated Jan. 16, 2018 in Patent Application No. JP 2014-062701.

Hidenori Takeshima, "Method for Estimating k-t Sensitivity from Under-Sampled Data with No Training Scans," Proceedings of International Society for Magnetic Resonance in Medicine, 2013, p. 3839.

* cited by examiner

MAGNETIC RESONANCE IMAGING APPARATUS AND IMAGE PROCESSING APPARATUS

CROSS-REFERENCE TO RELATED APPLICATION(S)

This application is based upon and claims the benefit of priority from Japanese Patent Application No. 2014-062701, filed on Mar. 25, 2014; the entire contents of which are incorporated herein by reference.

FIELD

Embodiments described herein relate generally to a magnetic resonance imaging apparatus and an image processing apparatus.

BACKGROUND

Magnetic resonance imaging (MRI) apparatus is apparatus that visualizes internal body information of a subject utilizing a nuclear magnetic resonance phenomenon. MRI apparatus uses coils to collect data called k-space data by sampling nuclear resonance signals from specific atomic nuclei (e.g., atomic nuclei of hydrogen atoms) in a subject and applies Fourier transform to the k-space data to obtain magnetic resonance (MR) images.

The nuclear resonance signals are sampled as one dimensional data. The MRI apparatus collects data necessary to produce two-dimensional or three-dimensional MR images by repeating one dimensional sampling in a k-space. When the k-space data is sampled with the same resolution (full sampling) as the MR image to be output, the MR image can be produced by applying Fourier transform to the acquired k-space data.

It is known that the MRI apparatuses take time to perform the sampling. If it takes time to perform the sampling in capturing time-series data using the MRI apparatus, an imaging speed is reduced. As a result, imaging cannot follow the movement of the subject. Various techniques to achieve high speed imaging have been researched and developed. One of such techniques is called parallel imaging (PI). In the parallel imaging, the k-space data is collected using a sampling pattern (undersampling) whose number of samples is smaller than that of full sampling and a plurality of coils. When Fourier transform is applied to the k-space data after the undersampling without any change, aliasing occurs. In the parallel imaging, the MR image having no aliasing caused by the undersampling is produced using a difference in sensitivity caused by the geometrical arrangement of the coils.

The following describes a procedure of sensitivity encoding (SENSE), which is one form of the parallel imaging. Information about a sensitivity distribution of each coil is collected in advance by a reference scan, for example. The MRI apparatus, then, performs Fourier transform using the undersampled k-space data of the respective coils obtained by image scan to generate the MR images in relation to the respective coils. Thereafter, the MRI apparatus estimates a true MR image on the basis of a premise that the MR images in relation to the respective coils are images obtained by performing, on the true MR image, product-sum operation of the sensitivity distribution information of the respective coils and aliased signals of the respective coils.

In k-t SENSE, which is one form of the extended SENSE, aliasing is removed by the SENSE in a space where Fourier transform is applied to the time-series MR images on a temporal axis. In the parallel imaging, a value obtained by dividing the number of samples in the full sampling by the number of samples in the undersampling is called a reduction factor R. In the SENSE and the extended SENSE techniques, the sampling is often performed at the same intervals in the k-space so as to remove the aliasing with a small amount of computation.

In the SENSE and the k-t SENSE, the larger the reduction factor R is, the larger a reconstruction noise is. As techniques to reduce the reconstruction noise, techniques such as regularization and compressed sensing that use prior knowledge are known. The reduction of the large reconstruction noise needs to increase dependency on such prior knowledge. As a result, the obtained MR image is strongly influenced by the prior knowledge given in the regularization. Especially, reproducibility of detailed structure in the obtained MR image is damaged.

DETAILED DESCRIPTION

A magnetic resonance imaging apparatus according to an embodiment includes a collector, a transformation module, an unfolding module and an inverse transformation module. The collector collects time-series k-space data of a plurality of channels while spatially changing a sampling position. The transformation module obtains transformed space data of the respective channels by applying, to the time-series k-space data of the respect channels, Fourier transform on a spatial axis and certain transformation on a temporal axis. The unfolding module eliminates a signal point on a basis of a certain criterion and performs unfolding using the transformed space data on the respective channels and sensitivity distribution information on the respective channels; and the inverse transformation module applies inverse transformation of the certain transformation on the temporal axis to an unfolded data on which the signal point has been eliminated and the unfolding has been performed.

The following describes a magnetic resonance imaging apparatus and an image processing apparatus according to embodiments in detail.

First Embodiment

Figure 1:
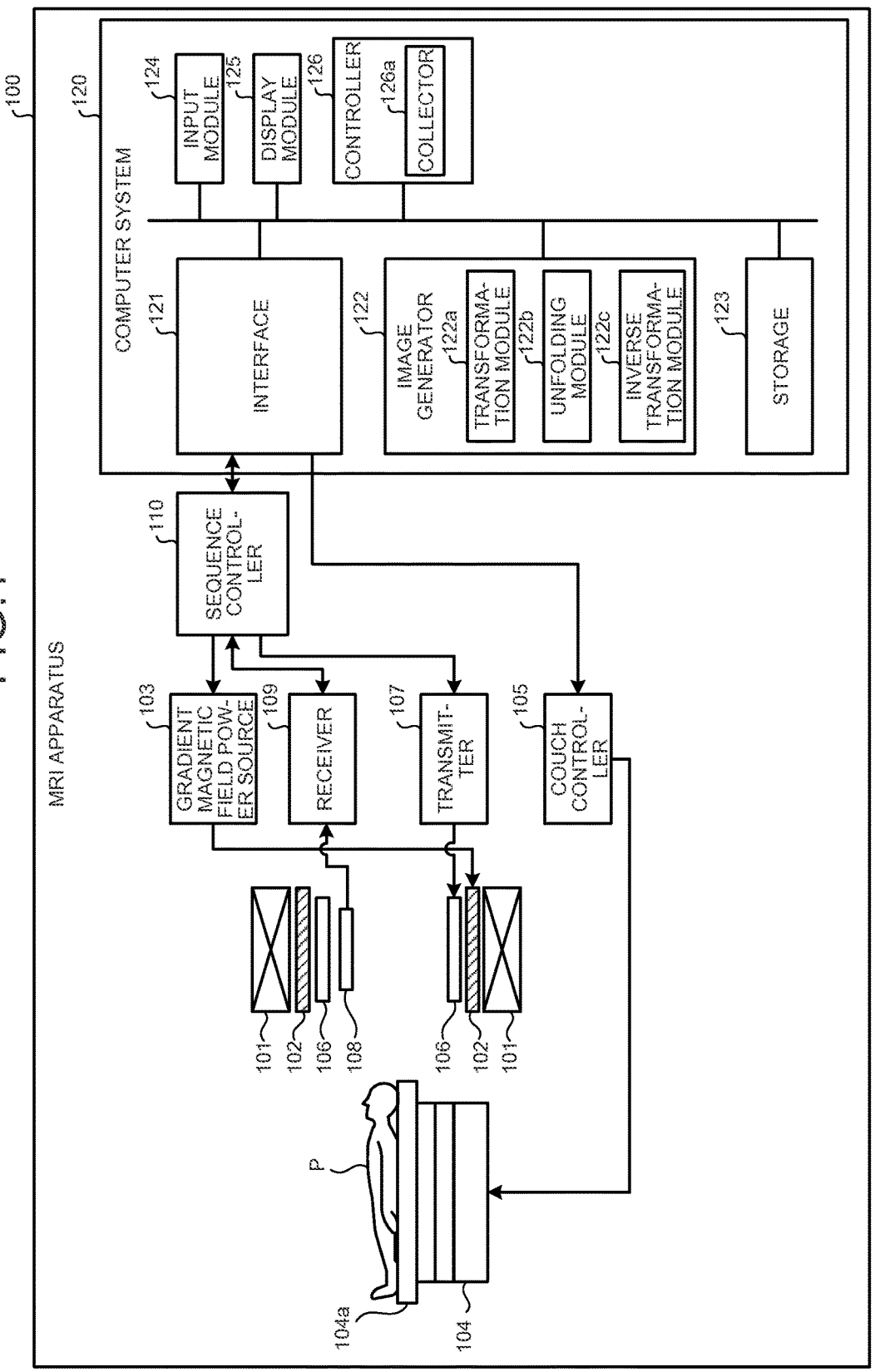
FIG. 1 is a functional block diagram illustrating a structure of a magnetic resonance imaging (MRI) apparatus according to a first embodiment.

FIG. 1 is a functional block diagram illustrating a configuration of an MRI apparatus according to a first embodiment. As illustrated in FIG. 1, the MRI apparatus 100 includes a static magnetic field magnet 101, a gradient coil 102, a gradient magnetic field power source 103, a couch 104, a couch controller 105, a transmission coil 106, a transmitter 107, a reception coil 108, a receiver 109, a sequence controller 110, and a computer system 120. The MRI apparatus 100 does not include a subject P (such as a human body).

The static magnetic field magnet 101 is a hollow magnet having a cylindrical shape, and generates a uniform static magnetic field in the inside space thereof. Examples of the static magnetic field magnet 101 include a permanent magnet and a superconductive magnet. The gradient coil 102 is a hollow coil having a cylindrical shape, and disposed inside the static magnetic field magnet 101. The gradient coil 102 is formed of a combination of three coils that correspond to respective axes of X, Y, and Z that are orthogonal to each other. The three coils are individually supplied with an electric current from the gradient magnetic field power source 103, and each generate a gradient magnetic field having a magnetic field strength that varies along the respective axes of X, Y, and Z. Here, the Z-axial direction is parallel to that of the static magnetic field.

The gradient magnetic field power source 103 supplies an electric current to the gradient coil 102. The gradient magnetic fields on the respective axes of X, Y, and Z generated by the gradient coil 102 correspond to a slice-selecting gradient magnetic field Gs, a phase-encoding gradient magnetic field Ge, and a read-out gradient magnetic field Gr, respectively, for example. The slice-selecting gradient magnetic field Gs is used to determine a given image capturing cross-section. The phase-encoding gradient magnetic field Ge is used to alter the phase of an MR signal depending on a spatial location. The read-out gradient magnetic field Gr is used to alter the frequency of the MR signal depending on the spatial location.

The couch 104 includes a couchtop 104a on which a subject P is placed, and inserts the couchtop 104a in a state where the subject P is placed thereon into a hollow (imaging port) of the gradient coil 102, under the control of the couch controller 105. Generally, the couch 104 is installed such that the longitudinal direction thereof is parallel to the central axis of the static magnetic field magnet 101. The couch controller 105 drives the couch 104 to move the couchtop 104a in the longitudinal direction and the vertical direction, under the control of the computer system 120.

The transmission coil 106 is disposed inside the gradient coil 102, and supplied with radio frequency (RF) pulses from the transmitter 107 to generate a high-frequency magnetic field. The transmitter 107 supplies the transmission coil 106 with RF pulses corresponding to a Larmor frequency that is determined based on the type of target atom nuclei and a magnetic field strength. The reception coil 108 is disposed inside the gradient coil 102, and receives an MR signal generated from the subject P by influence of the high-frequency magnetic field. When the reception coil 108 receives an MR signal, the reception coil 108 outputs the received MR signal to the receiver 109. In the first embodiment, the reception coil 108 is a coil array having one or more, typically a plurality of, reception coils.

The receiver 109 generates MR data based on the MR signal that is output from the reception coil 108. Specifically, the receiver 109 generates MR data by converting the MR signal that is output from the reception coil 108 into digital data. The receiver 109 also transmits the generated MR data to the sequence controller 110. The receiver 109 may be provided on the gantry device that includes the static magnetic field magnet 101 and the gradient coil 102. In the first embodiment, the MR signals output from the respective coil elements included in the reception coil 108 are appropriately divided or combined, and then output to the receiver 109 in a unit called a channel, for example. The MR data is, thus, handled channel by channel in subsequent stages from the receiver 109 onwards. The total number of coil elements and the total number of channels may be equal to each other. The total number of channels may be smaller than the total number of coil elements, or conversely, the total number of channels may be larger than the total number of coil elements. In the following description, when it is denoted that certain processing is performed for each channel, the processing may be performed for each coil element or for each channel that is formed by dividing or combining coil elements. The timing at which the coil elements are divided or combined is not limited to the timing described above. The MR signals or the MR data may be divided or combined in a unit of channel until the processing performed by an image generator 122, which is described later.

The sequence controller 110 drives the gradient magnetic field power source 103, the transmitter 107, and the receiver 109 based on sequence information transmitted from the computer system 120, thereby imaging the subject P. The sequence information is information that defines a process for executing imaging. The sequence information defines the intensity of the power source to be supplied from the gradient magnetic field power source 103 to the gradient coil 102, timing at which the power source is supplied, the intensity of RF pulses to be transmitted from the transmitter 107 to the transmission coil 106, timing at which the RF pulses are applied, and timing at which the receiver 109 detects an MR signal, for example.

When the sequence controller 110 receives MR data from the receiver 109 as a result of driving the gradient magnetic field power source 103, the transmitter 107, and the receiver 109 to image the subject P, the sequence controller 110 transmits the received MR data to the computer system 120.

The computer system 120 controls the MRI apparatus 100 overall, performs data collection, image production, and others, and includes an interface 121, the image generator 122, a storage 123, an input module 124, a display module 125, and a controller 126.

The interface 121 sends the sequence information to the sequence controller 110 and receives the MR data from the sequence controller 110. Upon receiving the MR data, the interface 121 stores the received MR data in the storage 123. The storage 123 stores therein time-series k-space data of a plurality of respective channels.

The image generator 122 produces an image using data collected by a collector 126a and data stored in the storage 123. The image generator 122 includes a transformation module 122a, an unfolding module 122b, and an inverse transformation module 122c. The transformation module 122a obtains transformed space data of the respective channels by applying, to the time-series k-space data of the respect channels collected by the collector 126a described later, Fourier transform on a spatial axis (spatial direction) and certain transformation on a temporal axis (temporal axis direction). The unfolding module 122b eliminates a part of signal points before performing unfolding, on a basis of a certain criterion and performs unfolding using the transformed space data on the respective channels and sensitivity distribution information on the respective channels. The inverse transformation module 122c applies inverse transformation of the certain transformation on the temporal axis to an unfolded data on which the signal point has been eliminated and the unfolding has been performed. More specifically, the inverse transformation module 122c applies inverse transformation of the certain transformation in the temporal axis direction to a data string of the unfolded data obtained by the unfolding module 122b and signal values set in accordance with a certain criterion, to the signals which were eliminated. The image produced by the image generator 122 is displayed by the display module 125 if necessary or sent to the storage 123 so as to be stored therein.

The storage 123 stores therein the MR data received by the interface 121, image data generated by the image generator 122, and the like. The storage 123 is a semiconductor memory element such as a random access memory (RAM) and a flash memory, a hard disk, and an optical disk, for example. The input module 124 receives various instructions and information inputs from an operator. The input module 124 is a pointing device such as a mouse and a trackball, and an input device such as a keyboard. The display module 125 displays, under the control of the controller 126, various information such as image data. The display module 125 is, for example, a display device such as a liquid crystal display.

The controller 126 controls the whole of the MRI apparatus 100. Specifically, imaging is controlled as follows. The collector 126a included in the controller 126 produces the sequence information on the basis of imaging conditions input by the operator through the input module 124 and transmits the produced sequence information to the sequence controller 110. The collector 126a collects the time-series k-space data of a plurality of channels while spatially changing a sampling position. The controller 126 controls the production of the image performed by the image generator 122 using the MR data transmitted from the sequence controller 110 as a result of the imaging and controls the display performed by the display module 125. The controller 126 is an integrated circuit such as an application specific integrated circuit (ASIC) or a field programmable gate array (FPGA), or an electronic circuit such as a central processing unit (CPU) or a micro processing unit (MPU), for example.

The following describes terms used in the following embodiment.

In the following embodiment, an x-space is a hydrogen distribution image space (in the embodiment, images captured from objects other than hydrogen atoms are also called hydrogen distribution images for convenience sake), and x-space data is a set of signal points in the x-space. Different signal points in the x-space correspond to signal points at different positions in the x-space. For example, a three-dimensional hydrogen distribution image of a brain is the three-dimensional x-space data. A two-dimensional x-space image taken from a certain cross section of a heart is the two-dimensional x-space data.

In addition, k-t space data is the time-series k-space data. By applying Fourier transform to the k-t space data in the spatial direction, the time-series x-space data is obtained. By applying Fourier transform to the time-series x-space data in the temporal axis direction, x-f space data is obtained. That is, the x-f space data is the data in which the time-series x space data is expressed by coefficient values after Fourier transform. A position of each signal point in the x-f space data is determined when a position of the signal point on the x axis and a position of the signal point on the f axis are determined. Hereinafter, the position of the signal point on the x axis and the position of the signal point on the f axis are also described as the x-axis position and the f-axis position, respectively. The f means frequency.

In the following embodiment, the transformation module 122a obtains the x-f space data of each channel by applying Fourier transform to the k-t space data of each channel in the spatial direction and further applying Fourier transform in the temporal axis direction. The unfolding module 122b performs signal elimination processing on a part of the data produced after the unfolding and thereafter obtains one piece of x-f space data having no aliasing by the unfolding using the pieces of x-f space data corresponding to the number of channels and the pieces of sensitivity distribution information corresponding to the number of channels. The inverse transformation module 122c applies inverse Fourier transform, in the temporal axis direction, to the x-f space data in which a value according to a separately determined criterion is set to the value of the signal eliminated in advance by the signal elimination processing, thereby producing a hydrogen distribution image. In the following description, the pieces of x-f space data corresponding to the number of channels are called x-f space data before the unfolding and one piece of x-f space data obtained after the unfolding is called x-f space data after the unfolding for discriminating them from each other in some cases.

The following describes the unfolding processing in sensitivity encoding (SENSE) as a preparation for the description of the embodiment. The positions of signal points in an image after the unfolding are expressed as $p=1, \ldots, n_p$ and the sampling is performed in the k-space at $n_p$ signal point intervals. In an image produced from the k-space data obtained by each coil by Fourier transform (or inverse Fourier transform), folded signals are overlapped in the y direction. In the SENSE, when the sensitivity of each coil is already known, an unfolded image z(p) is reproduced from the folded images thus obtained. In the following description, both of the Fourier transform and the inverse Fourier transform are called Fourier transform.

By applying Fourier transform to the k-space data after the sampling at $n_p$ signal point intervals, folded images are obtained in which $n_p$ signal points are overlapped. In the SENSE, attention is paid to a process in which a specific signal point is produced in the folded image. With regard to the signal point of interest in the folded image, the following equation (1) holds for each coil.

$$\rho(C) = \sum_{p=1}^{n_p} S(c, p) z(p) \quad (1)$$

where respective coils are expressed as $c=1, \ldots, n_c$, $\rho(c)$ is the signal point value in the folded image of each coil, $z(p)$ is the corresponding signal value in the unfolded image, and $S(c,p)$ is the sensitivity of each coil with respect to the unfolded image.

When the sensitivity of each coil is already known, the number $n_c$ of equations having $n_p$ unknown variables $z(p)$ is obtained from equation (1). The $n_c$ is the number of coils. A linear system including $n_c$ equations (1) is expressed as $\rho=Sz$ in a matrix notation. Taking into consideration a noise covariance matrix $\Psi$ of the coils, z can be estimated by equation (2).

$$z=(S^*\psi^{-1}S)^{-1}S^*\psi^{-1}\rho \quad (2)$$

In the following embodiment, the processing to estimate z from ρ is called "unfolding". It is known that a signal to noise ratio (SNR) of the image obtained by performing Fourier transform and the unfolding to the k-space data collected by the sampling at $n_p$ signal point intervals is expressed by equation (3) using the SNR of the image produced from the k-space data collected by the full sampling without undersampling, the signal point interval $n_p$, and a g-factor.

$$SNR_p^{SENSE} = \frac{SNR_p^{full}}{g_p\sqrt{n_p}} \quad (3)$$

The SNR is a value obtained by dividing the variance of signal by the variance of noise. The larger the value of the SNR, the smaller the noise power. The smaller the value of the SNR, the larger the noise power. The g-factor is a numerical value equal to or larger than one that satisfies equation (4).

$$g_p = \sqrt{[(S^*\psi^{-1}S)^{-1}]_{p,p}(S^*\psi^{-1}S)_{p,p}} \quad (4)$$

In this case, the signal point interval $n_p$ is equal to the reduction factor R. The reduction factor R is the ratio of the amount of data acquired by the full sampling to the amount of data acquired by the undersampling.

When an image is reconstructed from time-series k-space data, it is known that using k-t SENSE makes it possible to reconstruct an image with higher quality than that by SENSE. In k-t SENSE, x-f space data is calculated by applying a Fourier transform to k-space data not only in the spatial direction but also in the temporal axis direction, and unfolding is performed in x-f space. The x of x-f space represents the spatial direction. The f of x-f space represents the other axis direction in the space after transformation. The other axis is a result of the transformation performed in the temporal direction and described as the time-transformed axis.

Figure 2:
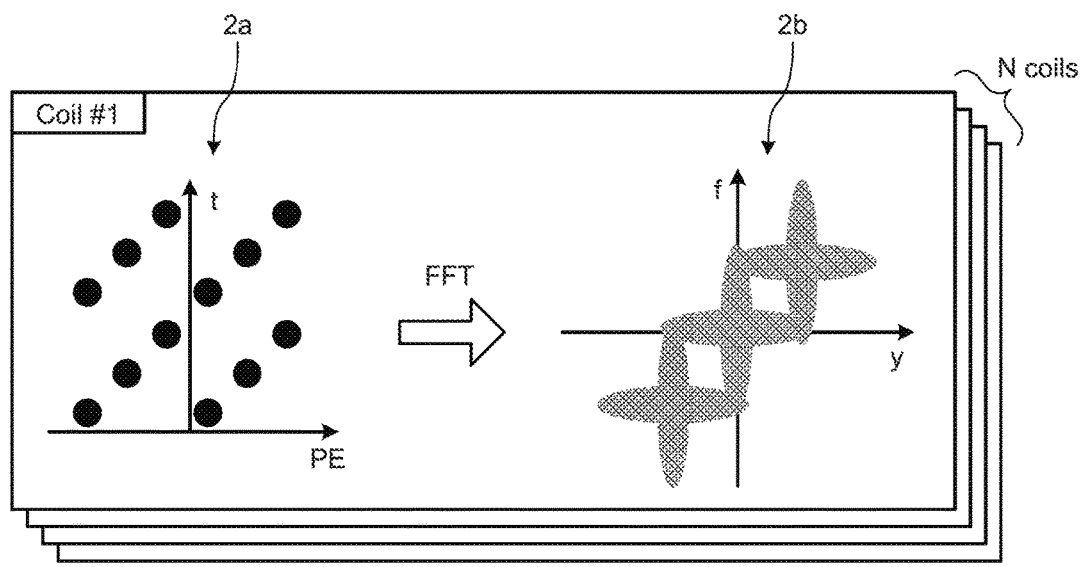
FIG. 2 is a schematic diagram explaining an outline of k-t SENSE.
Figure 3:
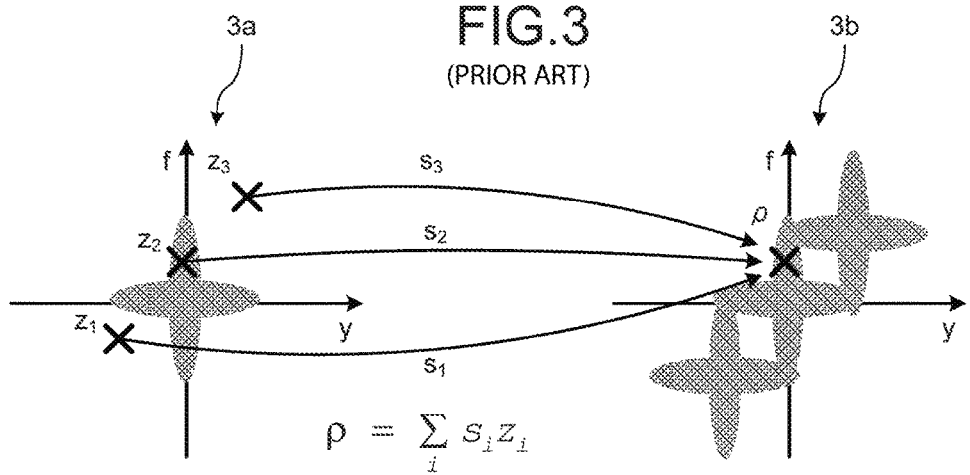
FIG. 3 is a schematic diagram explaining a correspondence between x-f space data before and after unfolding in the k-t SENSE.
Figure 4:
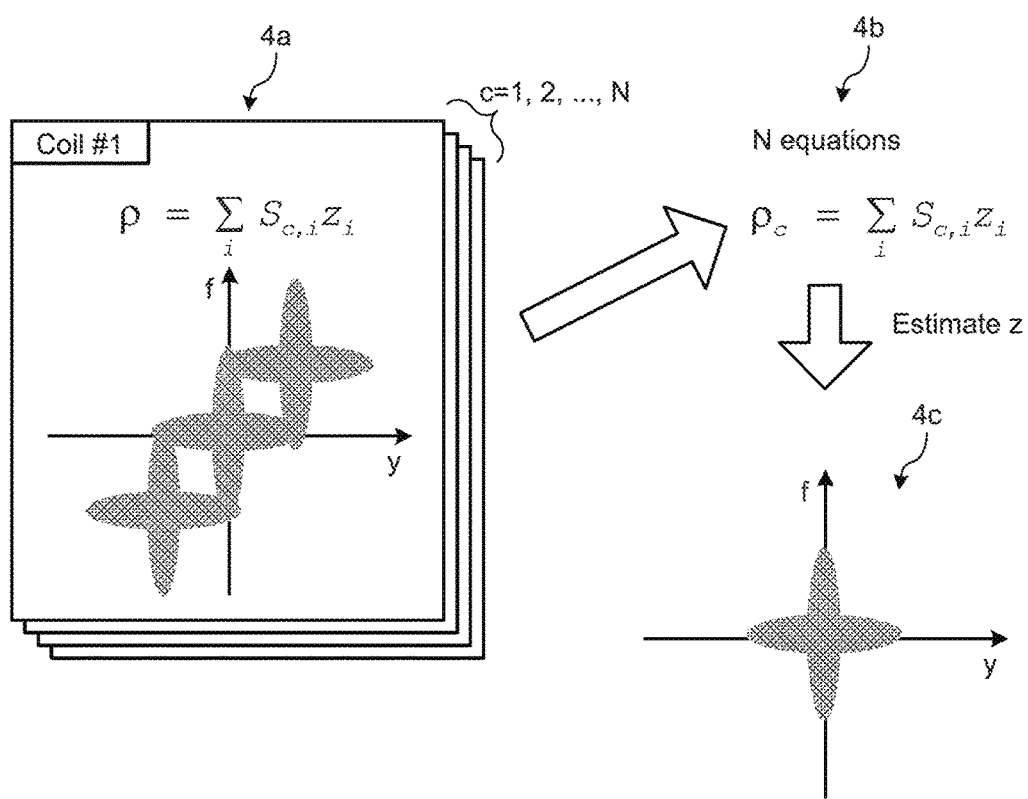
FIG. 4 is a schematic diagram explaining image production in the k-t SENSE.

The following describes the outline of the k-t SENSE with reference to FIGS. 2 through 4. FIG. 2 is a schematic diagram explaining the outline of the k-t SENSE. FIG. 3 is a schematic diagram explaining a correspondence between the x-f space data before and after the unfolding in the k-t SENSE. FIG. 4 is a schematic diagram explaining image production in the k-t SENSE.

As illustrated in a graph 2a of FIG. 2, in the k-t SENSE, the k-space data is sampled by periodically changing the sampling position in the spatial direction (a phase encoding (PE) direction in FIG. 2). In the graph 2a, the filled circles indicate the positions where the sampling is performed. When the collected k-space data is subjected to Fourier transform without any change, aliasing occurs in the x-f space as illustrated in a graph 2b of FIG. 2. The respective signal points under the influence of the aliasing in the x-f space data (the graph 2b of FIG. 2) are ideally equal to those obtained as a result of product-sum operation of R signal points taken out from the x-f space data to be reconstructed (a graph 3a of FIG. 3) and the sensitivity distribution information in the x-f space corresponding to their positions (a graph 3b of FIG. 3).

The x-f space data to be reconstructed (a graph 4c of FIG. 4) can be estimated (unfolded) by producing equations (equation 4b of FIG. 4) for all of the coils with respect to the respective signal points of the data under the influence of the aliasing (the graph 4a of FIG. 4). It is empirically known that the reduction factor R is not set to a too large value because the larger the reduction factor R, the larger the g-factor in a 1.5 tesla (T) or 3T MRI apparatus. As a countermeasure for this limitation, a technique is known in which knowledge is introduced such as introduction of a regularization term (regularization) or prior knowledge. The introduced knowledge influences the reconstructed image. Therefore, the introduction of knowledge is preferably minimized as much as possible.

The following embodiment, thus, employs a technique to "eliminate" a part of signal points that are not zero and to be estimated in order to reduce, without the introduction of knowledge, the influence on the image quality when the reduction factor R is large, targeting on x-f space data.

In the embodiment, a reconstruction error has the following meaning. Let an image produced from data collected by the full sampling under an ideal condition where no noise is included in a collection system be called a true image. In the SENSE, if no noise were included in a collection system and a solution is uniquely solved from a linear system without using prior knowledge, an image after the unfolding would be exactly the true image. In the real collection system, however, noise is included in the collection system. Thus, the image after the unfolding is often not identical to true image. The reconstruction error conceptually indicates an amount of the difference between the image produced from the real collection system and the true image.

With an increase in the number of unknowns to be calculated due to the increase in the reduction factor R, the reconstruction error is exponentially increased. In the first embodiment, the signal points that have small SNRs and may cause the reconstruction errors to be increased are eliminated from the targets of the estimation of signal values by the unfolding prior to the unfolding using an elimination signal determination criterion. As a result, a reduction of the reconstruction error is expected. The expected reconstruction error does not vary (is determined by the sensitivity) by the position on the f axis whereas the intensity of the signal is reduced on the f axis as the frequency is increased. Thus, the level of the reconstruction error is larger than the intensity of the estimated signal from a position beyond a certain position on the f axis.

As will be described later, in the first embodiment, the elimination signal determination criterion may depend not only on the f-axis position but also on the x-axis position.

The elimination of a part of the signal points prior to the unfolding can reduce the reconstruction error as described above. This processing, however, eliminates the intrinsically present signal points simultaneously, thereby causing the occurrence of a new reconstruction error. If a signal point having strong signal intensity is eliminated prior to the unfolding, a newly added reconstruction error becomes larger. As a result, an appropriate image production cannot be performed. In the first embodiment, the reconstruction error is reduced by choosing an appropriate elimination signal determination criterion as described below.

In the SENSE, it is often difficult to discriminate high priority data from low priority data on the basis of the position in the x-space because of the nature of the data. In contrast, the priority of data far from the origin (the center) in the f-axis direction (also described as data having a large f-axis position) is often lower than that of data near the center in the f-axis direction (also described as data having an f-axis position near the center) in the k-t SENSE. The elimination of the signal points, thus, can be appropriately performed effectively using this nature of the data.

The following describes a processing procedure in the first embodiment. In the embodiment described below, the sensitivity distribution information in the x-f space is given (or already known). The sequence controller 110 collects the sensitivity distribution information in the x-f space by some sort of means. For example, the information may be collected by a reference scan or obtained from data collected by an imaging scan. Any techniques are applicable to obtain the sensitivity distribution information in the x-f space.

Figure 5:
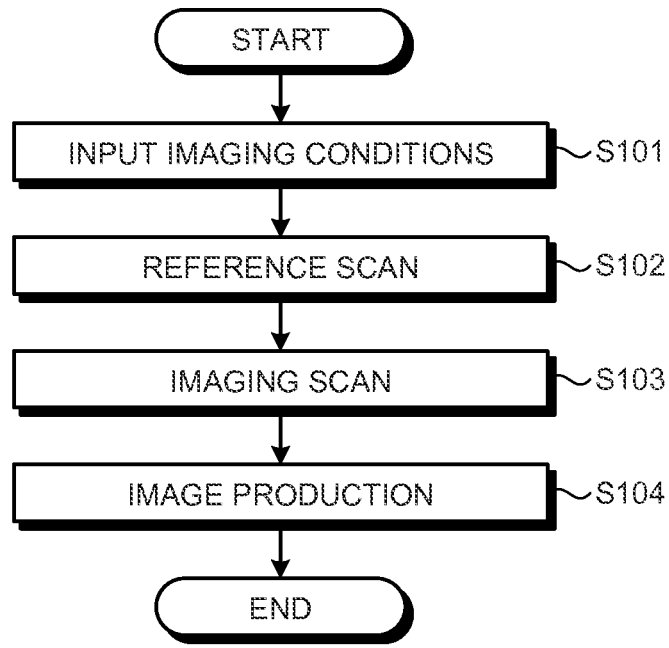
FIG. 5 is a flowchart illustrating a processing procedure in the first embodiment.

FIG. 5 is a flowchart illustrating a processing procedure in the first embodiment. The controller 126 receives input of imaging conditions from an operator (step S101). The collector 126a produces the sequence information on the basis of the imaging conditions input from the operator and transmits the produced sequence information to the sequence controller 110, which controls the implementation of the reference scan (step S102). Examples of the reference scan include a scan to collect an image for positioning, a shimming scan to correct non-uniformity in a magnetostatic field, and a scan to collect the sensitivity distribution information and the like.

After the completion of the reference scan, the collector 126a produces the sequence information on the basis of the imaging conditions input by the operator and transmits the produced sequence information to the sequence controller 110, which controls the implementation of the imaging scan that collects an output image (e.g., an image output for diagnosing) (step S103). In the first embodiment, the collector 126a collects the time-series k-space data of the multiple channels in the imaging scan.

In the first embodiment, the sequence controller 110 collects the time-series k-space data by the undersampling in accordance with the reduction factor R. The number of pieces of time-series k-space data collected by the sequence controller 110 is one Rth of that in the full sampling. Specifically, the sequence controller 110 collects the following number of signal points as the k-space data. The number is obtained by the following equation. The number=the number of signal points in a read out (RO) direction×the number of frames in a phase encoding (PE) direction÷the reduction factor× the number of channels. The sequence controller 110 collects the time-series k-space data while shifting the collection position in the temporal direction as illustrated in the graph 2a of FIG. 2, for example.

The image generator 122 produces an image using the time-series k-space data of the multiple channels that are collected at step S103 and stored in the storage 123 (step S104). The produced image is stored in the storage 123 or displayed on the display module 125 if needed.

Figure 6:
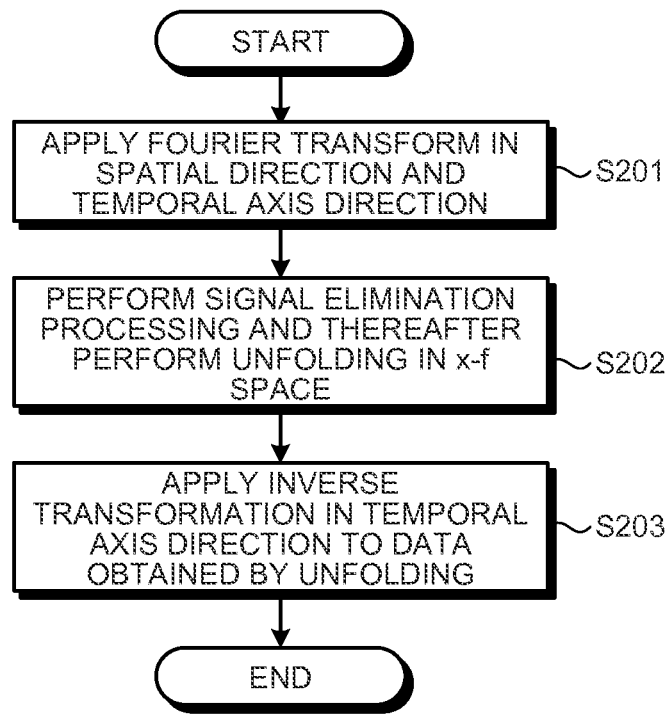
FIG. 6 is a flowchart illustrating a processing procedure of the image production in the first embodiment.

FIG. 6 is a flowchart illustrating the processing procedure of the image production in the first embodiment and corresponds to step S104 in FIG. 5.

The transformation module 122a reads out the time-series k-space data of the multiple channels from the storage 123 and applies Fourier transform in the spatial direction and the temporal axis direction to the time-series k-space data of the respective channels so as to obtain the x-f space data of the respective channels (step S201). The transformation module 122a outputs the obtained x-f space data of the respective channels to the unfolding module 122b.

Specifically, the time-series k-space data of the multiple channels read out from the storage 123 by the transformation module 122a has each of the axes of the RO direction in the k-space, the PE direction in the k-space, and the temporal direction. The time-series k-space data is prepared for the number of channels. The transformation module 122a performs Fourier transform on the time-series data with respect to the three axes of the RO direction in the k space, the PE direction in the k space, and the temporal direction, and outputs multidimensional data having the axis of the x direction of the hydrogen distribution image, the axis of the y direction of the hydrogen distribution image, and the axis of a spectrum f.

The unfolding module 122b eliminates in advance a part of the x-f space data produced after the unfolding by the signal elimination processing, which will be described later. The unfolding module 122b performs the unfolding in the x-f space using the given sensitivity distribution information about the respective channels in the x-f space and the x-f space data of the respective channels obtained at step S201, thereby obtaining the x-f space data having no aliasing after the unfolding (step S202). The unfolding module 122b outputs the x-f space data after the signal elimination processing and the unfolding to the inverse transformation module 122c. The processing at step S202 will be described later.

The inverse transformation module 122c applies the inverse transformation of the transformation applied in the temporal axis direction at step S201 (i.e., inverse Fourier transform in the first embodiment) to the x-f space data after the unfolding obtained at step S202 and obtains time-series hydrogen distribution images (step S203).

Specifically, the x-f space data after the unfolding before the inverse transformation is the multidimensional data having the axis of the x direction of the hydrogen distribution image, the axis of the y direction of the hydrogen distribution image, and the axis of the spectrum f, for example. The inverse transformation module 122c applies inverse Fourier transform to the data in the f-axis direction and obtains the time-series hydrogen distribution images each having the axes of the x direction of the hydrogen distribution image, the y direction of the hydrogen distribution image, and the time t.

The following describes the signal elimination processing performed at step S202. The signal elimination processing determines whether the signal point is left or neglected (eliminated) for each signal point of interest in the x-f space data after the unfolding. In the first embodiment, the signal value of the signal point determined as the elimination target is replaced with zero (0).

In the first embodiment, a case is mainly described where the number of channels is equal to or larger than the reduction factor R. However, the number of channels is not limited to this example. For example, when the unfolding is performed where the number of channels is eight and the reduction factor R is four, an overcomplete system (the number of equations is in excess of the number of unknowns) is made because the unfolding module 122b can set up eight simultaneous equations whereas the number of unknowns is four. In such a case where the number of equations is in excess of the number of unknowns, the unfolding module 122b can appropriately unfold the data received from the transformation module 122a using a least-square technique, for example. In the unfolding, the g-factor after the signal elimination processing may be calculated and prior knowledge may be added when the g-factor exceeds a separately determined value. In contrast, when the number of channels is smaller than the reduction factor R, the number of unknowns is larger than the number of equations when the unfolding is performed. In this case, the unfolding can be performed, without applying prior knowledge, by forcibly applying the signal elimination processing, which will be described later, until at least the number of unknowns is equal to or smaller than the number of channels. Alternatively, the prior knowledge may be added when the number of unknowns exceeds the number of channels or the g-factor exceeds a separately determined value without forcibly applying the signal elimination processing subject to the condition where the number of unknowns is equal to or smaller than the number of channels.

In the first embodiment, the unfolding module 122b determines in advance whether to eliminate the signal point in the x-f space data produced after the unfolding for each signal point prior to the unfolding on the basis of a certain criterion. The unfolding module 122b performs the unfolding by the SENSE using sensitivity map data in the x-f space using the signal points of the respective channels in the x-f space before the unfolding as an input, and using the signal points after the unfolding that have undergone signal elimination processing as an output.

In the first embodiment, the unfolding module 122b determines whether to eliminate the signal point in the x-f space data for each signal point on the basis of a certain criterion. In the first embodiment, the unfolding module 122b estimates an evaluation value corresponding to the level of a noise for each signal point as the certain criterion, makes a comparison between the evaluation value when a signal point of interest is eliminated and the evaluation value when the signal point of interest is not eliminated, and eliminates the signal point of interest based on the comparison. The evaluation value may be a signal to noise ratio (SNR), for example. Specifically, the SNR when a signal point of interest is eliminated and the SNR when the signal point of interest is not eliminated are obtained, and the signal point of interest may be eliminated in the case where the SNR when the signal point of interest is eliminated is larger than the SNR when the signal point of interest is not eliminated. In this case, the determination is performed for each signal point in the x-f space data. As a result, the signal elimination processing is performed depending on both of the spatial axis and the temporal axis.

The certain criterion for determining whether to eliminate the signal point in the x-f space data is not limited to the example where the SNR when a signal point of interest is eliminated and the SNR when the signal point of interest is not eliminated are compared with each other. The unfolding module 122b may determine whether to eliminate the signal point on the basis of various predetermined criteria.

The procedure for implementing the certain criterion whether to eliminate the signal point in the x-f space data is as follows. The unfolding module 122b performs the determination on a set of data points of all of the channels, each data point being located at the same position in the corresponding x-f space before the unfolding, and repeats the determination on all of the positions in the respective x-f spaces before the unfolding. For example, when 100 signal points in the PE direction and 100 signal points in the RO direction are collected from each of 20 frames in the temporal direction, and the reduction factor R is four, one set in the procedure for implementing the certain criterion whether to eliminate the signal point in the x-f space data is four signal points, that is, four is the value of the reduction factor R. The unfolding module 122b, thus, performs individual calculation on 10000 (=200×100×20÷4) sets in total. The certain criterion whether to eliminate the signal point in the x-f space data can be determined as follows. For example, the certain criterion whether to eliminate the signal point in the x-f space data is determined such that the feature of data after unfolding becomes better. Specifically, a signal having a weak intensity will probably cause an accumulation of errors. Thus, the unfolding module 122b may determine the certain criterion whether to eliminate the signal point such that the signal point in the output (after the unfolding) that is likely to have a weak signal is eliminated, for example. When the number of channels is larger than the reduction factor R, the signal points after the unfolding can be eliminated without any inhibition until the number of channels is equal to the reduction factor R.

As for the case where the SNR when the signal point in the x-f space data after the unfolding is eliminated and the SNR when the signal point in the x-f space data produced after the unfolding is not eliminated are compared with each other, the SNR when the signal point in the x-f space data produced after the unfolding is not eliminated is expressed by equation (5).

$$SNR_p^{SENSE} = \frac{SNR_p^{full}}{g_p\sqrt{n_p}} = \frac{\text{ESTIMATED SIGNAL INTENSITY}}{\text{ESTIMATED NOISE INTENSITY}} \times \frac{1}{g_p\sqrt{n_p}} \quad (5)$$

When the values of the estimated signal intensity, the estimated noise intensity, and of the g-factor are obtained, the value of the SNR in the case where the signal point is not eliminated can be obtained on the basis of these values. Likewise, for the SNR in the case where the signal point is eliminated, when the values of the corresponding estimated signal intensity, estimated noise intensity, and of the g-factor are obtained, the value of the SNR in the case where the signal point is eliminated can be obtained on the basis of these values. In the first embodiment, the unfolding module 122b determines whether to eliminate the signal point using equation (5) and the equation obtaining the SNR in the case where the signal point is eliminated, for example.

The following describes a technique for estimating the noise intensity (estimated noise intensity). In general, in peripheral data away from the center of the k-space, the signal intensity is weak while the noise intensity is strong unlike data near the center of the k-space. The unfolding module 122b, thus, randomly samples some elements away from the center of the k-space out of the k-space data and estimates the noise intensity by obtaining the variance and the covariance of the elements, for example.

The following describes a technique for estimating a signal intensity (estimated signal intensity). The unfolding module 122b collects in advance a large amount of k-space data and estimates the signal intensity by calculating an average signal intensity of the collected data. For the object of the embodiment, the absolute value of the signal intensity is not necessary but it is enough to obtain only a relative value in the temporal axis direction. The unfolding module 122b may use average signal intensity in each frequency as a relative value with respect to a direct current component in the temporal axis direction (a value near the center in the temporal axis direction).

The following describes a technique for estimating an error (additional noise intensity) between an observed value and a model. The error is caused by the elimination of the signal point using the model that sets the value of the signal point having signal intensity to zero. The additional noise caused by the elimination of the signal point can be handled in the same manner as the observed noise in the x-f space. If the noise intensity and the signal intensity in the k-space data can be estimated, the unfolding module 122b calculates the product sum of the signal intensity and the sensitivity distribution information for each signal point eliminated from the targets of the unfolding, and estimates the additional noise intensity on the basis of the calculated size being added as the observed noise in the x-f space. Other techniques may also be used as the technique for estimating the additional noise intensity. For example, the unfolding module 122b may use a difference between the signal intensities as the estimation of the additional noise intensity.

For another example, the unfolding module 122b may prepare a table illustrating a perceptive weight for each frequency in the temporal axis direction and weight the additional noise for each frequency. The unfolding module 122b prepares in advance a table illustrating a contribution rate that indicates how much the frequency in the temporal axis direction contributes to an image, for each frequency, for example. The unfolding module 122b accumulates a lot of collected data on the same imaging target (e.g., the same organ), obtains how much an element of each frequency contributes to the image from the data, and produces the table, for example. The unfolding module 122b produces a table by setting an average value in the spatial direction from the given f-axis position as the weight of one piece of collected data with respect to the position on the f-axis. The table may be normalized such that the sum of all of the elements is one, if necessary.

In most cases, the larger the reduction factor R is, the larger the g-factor of the data collected by the MRI apparatus is. When a part of the signal points is eliminated, the g-factor is reduced. As an expense of the elimination, the eliminated signals cause the noise to be added to other signals.

Figure 7:
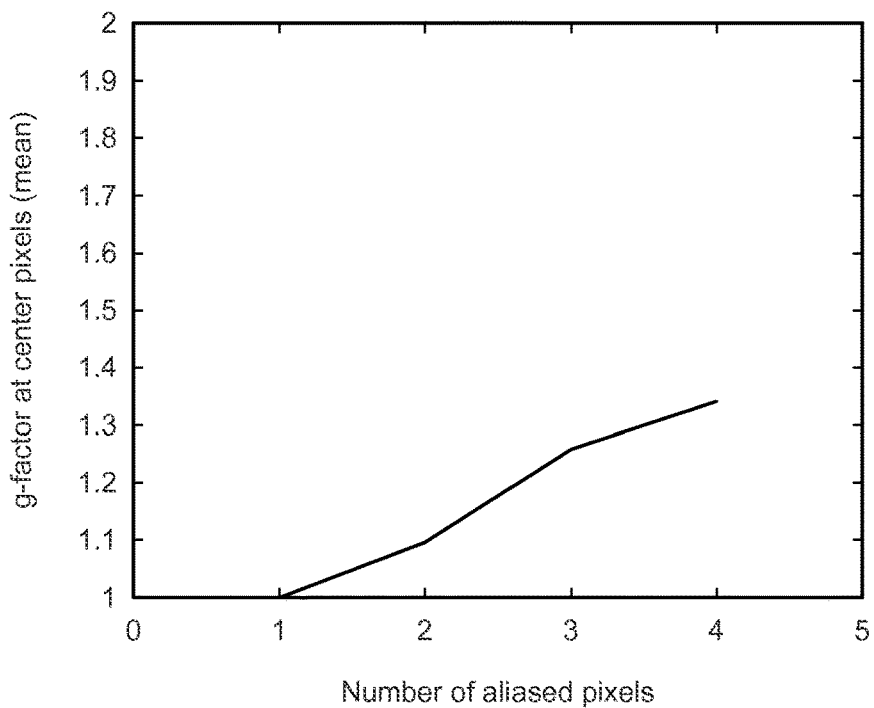
FIG. 7 is a schematic diagram illustrating that a g-factor is reduced by the elimination of signal points when a reduction factor is four in the first embodiment.
Figure 8:
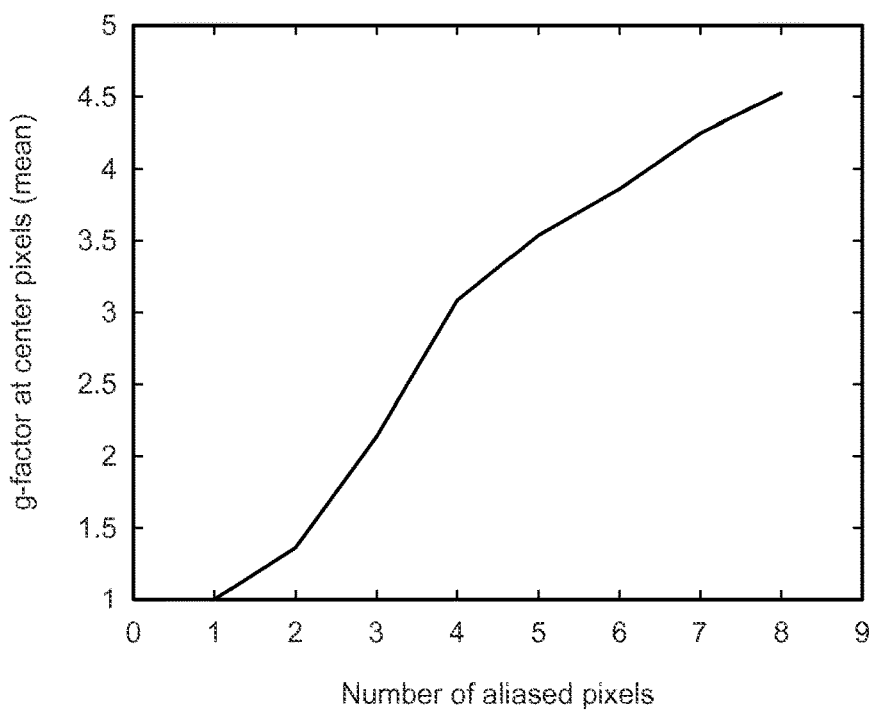
FIG. 8 is a schematic diagram illustrating that the g-factor is reduced by the elimination of the signal points when the reduction factor is eight in the first embodiment.

The following describes that neglecting part of the signals causes the g-factor to be reduced using numerical data with reference to FIGS. 7 and 8. FIG. 7 is a schematic diagram illustrating that the g-factor is reduced by the elimination of the signal points when the reduction factor R is four in the first embodiment. FIG. 8 is a schematic diagram illustrating that the g-factor is reduced by the elimination of the signal points when the reduction factor R is eight in the first embodiment. The horizontal axis represents the number signal points to spare while the vertical axis represents the g-factor. The g-factor indicates a noise amplification factor and has a numeric value equal to or larger than one. The closer to one the g- factor is, the smaller the amplification factor of the noise added to the signal to be unfolded is. As can be understood from FIGS. 7 and 8, neglecting part of the signal points can reduce the g-factor.

The unfolded image gets nearer to the expected image (the "true image") by the processing for eliminating the signal points in the following manner. The signal points estimated to have a weak signal intensity in the x-f space are sequentially eliminated as long as the intensity of the noise added to the other signal points caused by the elimination of the signal points does not exceed the amount of the reduction in the (perceptive) error in the other signal points caused by the elimination of the signal points.

As described above, in the first embodiment, a part of the signal points in a space after the unfolding is eliminated on the basis of a certain criterion before the unfolding of the x-f space data, thereby making it possible to reduce the influence on the image quality when the large reduction factor R is set in the parallel imaging. As a result, the image quality can be improved. In the first embodiment, elimination of a signal point is not determined simply by the size of the signal value, but is determined by comparing the SNR when the signal point is eliminated with the SNR when the signal point is not eliminated. As a result, a higher quality image having a high SNR can be obtained than that in a case where the determination is performed on the basis of the size of the signal value.

First Modification of the First Embodiment

The unfolding module 122b can perform the signal elimination using information learned from a plurality of pieces of data collected from a same object. The unfolding module 122b may estimate the signal intensity, the noise intensity, and the SNR using information learned from a plurality of pieces of data collected from a same object, for example. The unfolding module 122b may determine the signal elimination using information learned from a plurality of pieces of data collected from a same object, for example.

An example of the plurality of pieces of data collected from the same object is a plurality of pieces of data after imaging for each image capturing region of the subject. A plurality of images is assembled to form databases, where for example, in case of heart, only cardiac images are assembled, in case of brain, only cerebral images are assembled, and so on. Such a database makes it possible for the unfolding module 122b to obtain knowledge about a typical signal intensity, noise intensity, and SNR of the image. The typical signal intensity, noise intensity, and SNR and the typical movement of an object (a subject) to be imaged differ greatly according to the portion of the object to be imaged (the imaging region of the subject). Thus, the accumulation of knowledge for each portion of the object to be imaged is effective for the image reconstruction. For example, when a specific organ is absent at a specific location (i.e., in a case where it is known that only air is practically imaged at the location), the unfolding module 122b can make use of the knowledge for estimating the signal intensity and for determining the signal elimination.

When estimating the signal intensity, the unfolding module 122b may use an average of a plurality of pieces of data or by another technique such as the use of the medium value of a plurality of pieces of data, for example. When estimating the noise intensity, the unfolding module 122b may obtain a variance after extracting respective estimated signal intensities from a plurality of pieces of data, or using other techniques, for example. When estimating the SNR, the unfolding module 122b may use the estimated signal intensity and the estimated noise intensity, or other techniques, for example. When performing the signal elimination determination, the unfolding module 122b may target the signal points estimated in advance as having a weak signal intensity for the signal elimination without any condition, and perform the determination on other signal points by comparing the SNR when the signal point is eliminated with the SNR when the signal point is not eliminated, for example.

Second Modification of the First Embodiment

The unfolding module 122b may use some of the signal points of the collected data instead of or in combination with the use of information learned from a plurality of pieces of data collected from the same object. The unfolding module 122b can make use of some of the signal points for estimating the signal intensity, the noise intensity, and the SNR, or the signal elimination determination by interpolating, extrapolating, or smoothing them.

Third Modification of the First Embodiment

In embodiments described above, it is assumed that the value of the signal point subject to the elimination by the signal elimination criterion is replaced by zero. The embodiment is, however, not limited to this example. The unfolding module 122b may replace the value of the signal point subject to the elimination with a predetermined estimated value. The predetermined estimated value may be an estimated value estimated using information learned from a plurality of pieces of data collected from the same object or an estimated value estimated by interpolating, extrapolating, or smoothing the collected data, for example.

Fourth Modification of the First Embodiment

In the first embodiment, Fourier transform is applied as the transformation in the temporal axis direction. The embodiment is, however, not limited to this example. The transformation in the temporal axis direction is sufficient if invertible or approximately invertible transformation, and can be linear or non-linear transformation. For example, the transformation may be a wavelet transform and the like.

Second Embodiment

In the first embodiment, a technique is described in which the signal elimination determination is performed for each signal point produced after the unfolding in the x-f space. The embodiment is not limited to this technique. In a second embodiment, determinations independent of the x-axis direction is consideration. According to the second embodiment, it is expected that the number of arithmetic operations is reduced at most to one Nth where N is the number of data in the x-axis direction, thereby making it possible to reduce the amount of arithmetic operations. In the k-t SENSE, the priority of data far from the center in the time-transformed axis (e.g., the f axis) direction (also described as data having a large time-transformed axis position) is often lower than that of data near the center in the time-transformed axis direction (also described as data having a time-transformed axis position near the center). The number of operations can be reduced by maximally taking advantage of this property while minimizing the reconstruction error.

In the second embodiment, the unfolding module 122b eliminates the signal point using, as the certain criterion, a priority value on a time-transformed axis in a transformed space, the transform space being space after the Fourier transform is applied to the k-space data on the spatial axis and the certain transformation is applied on the temporal axis. In other words, the unfolding module 122b sets a priority order or priority coefficients that indicate the priority of the signal point to each position in the time-transformed axis direction, and determines whether to eliminate the signal point sequentially from the signal point at the position set to be the lowest priority in the time-transformed axis in the ascending order of priority using the priority order or the priority coefficient.

The unfolding module 122b may assign numbers to the respective positions in the time-transformed axis direction from 1, 2, 3, . . . , in the descending order of priority from the highest priority in view of image reconstruction and determine whether to eliminate each of the signal points in the descending order of the number from the highest assigned number, for example. The unfolding module 122b may assign numbers to the respective positions in the time-transformed axis direction from 1, 2, 3, . . . , in the ascending order of priority from the lowest priority in view of image reconstruction and determine whether to eliminate the signal point at a certain position in the ascending order of the number from the lowest number, for example. The unfolding module 122b may assign a real number indicating importance of the position as the priority coefficient for each position in the time-transformed axis direction and determine whether to eliminate each of the signal point in the ascending order of the assigned value from the lowest value.

The following describes examples of how the priority order or the priority coefficient is used. The concrete examples are as follows: (1) an example when Fourier transform is used as the transformation in the temporal axis direction and (2) another example when principal component analysis (PCA) is used as the transformation in the temporal axis direction.

It is known that, when the signal points are subjected to Fourier transform in the temporal axis direction, in general, the larger the frequency is, the smaller the average intensity of the Fourier coefficient is. It is thus preferable that the unfolding module 122b performs the signal elimination determination sequentially in the time-transformed axis direction from the frequency whose frequency difference from the position having the highest priority (direct current) in the time-transformed axis direction is largest, when Fourier transform is used as the transformation in the temporal axis direction. Transformations using a known basis such as Hadamard transform, wavelet transform, or discrete cosine transform also has the property that the larger the frequency is, the smaller the average intensity is. The signal elimination determination, thus, can be performed according to the same order as described above when such transformation is used.

On the other hand, when using a basis generated by the PCA is employed in the temporal axis direction, the eigenvalue represents the signal intensity. The unfolding module 122b, thus, performs the signal elimination determination sequentially in the ascending order of the eigenvalue of the basis from the basis having the smallest eigenvalue.

The unfolding module 122b can use a fixed-parameter constraint for the signal elimination determination, for example. A fixed-parameter constraint is a signal eliminating processing based on whether or not a predetermined condition is satisfied with a certain parameter being fixed, as criterion for the signal elimination processing.

For example, let us consider a case where the unfolding module 122b repeats calculations of obtaining SNR and making a comparison, for each signal point, one point after another, for sufficiently large number of times. As a consequence, let us consider a case where the unfolding module 122b obtains an empirical knowledge as to the relationship between the imaging subject and the signal elimination criterion. In this case, the unfolding module 122b may reduce the knowledge to an evaluation expression as a function of several parameters instead of the signal emanation determination criterion in the first embodiment and performed the signal eliminating processing with the fixed parameters. The use of this technique can markedly reduce the number of operations. In this case, the signal elimination processing corresponds to a simple processing that depends only on the time-transformed axis.

A Modification of the Second Embodiment

The following describes a modification of the second embodiment. The modification reduces the number of operations more drastically. In the modification, the unfolding module 122b selects around two frequencies near the position set to the highest priority in the time-transformed-axis direction as the targets of the unfolding. This technique can markedly reduce time taken to provide the result to a user, thereby making it possible to provide an additional value that the next examination items are adjusted with reference to the result of the unfolding, for example. For example, a usage can be conceived in which the reconstruction is performed using a simple technique first and, thereafter the reconstruction is performed using a precise technique. Such a usage allows the following. When imaging has failed partially due to some cause, a user can check the first reconstruction result using the simple technique and immediately determine whether imaging needs to be performed again without having to wait for the second reconstruction result using a precise technique.

First of all, we consider a case where the modification is applied to two-dimensional k-space data. In a modification of the second embodiment, for example, when a highest priority position on the time-transformed axis in a priority order is not an elimination target, the priority order indicating an order of priorities of signal points at respective positions on the time-transformed axis, the unfolding module 122b eliminates all signal points other than the highest priority position on the time-transformed axis, and when the highest priority position in the priority order on the time-transformed axis is an elimination target, the unfolding module 122b selects at least two positions in a descending order of the priority on the time-transformed axis from the highest priority position and eliminates all signal points other than signal points at the selected at least two positions. In other words, as an example of using a fixed parameter, when the target of the unfolding includes the highest priority position (center frequency) in the time-transformed axis direction (or includes a signal point whose expected signal intensity is the highest), only the signal point which has the highest priority is used for the reconstruction. When the target of the unfolding does not include the position described above, only two signal points closest to the highest priority (central frequency) position in the time-transformed axis direction (or two signal points with highest expected signal) are used for the reconstruction. This technique is described with reference to FIG. 9.

Figure 9:
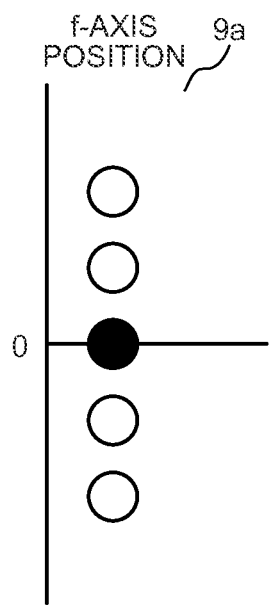
FIG. 9 is a schematic diagram explaining a signal elimination criterion in a modification of a second embodiment.
Figure 9:
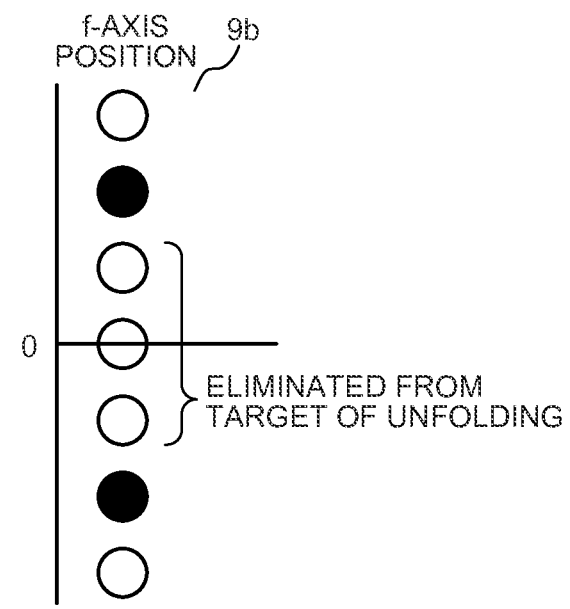

FIG. 9 is a schematic diagram explaining the signal elimination criterion in the modification of the second embodiment. FIG. 9 is a schematic diagram explaining a technique as an example of the fixed parameter. In the technique, when the target of the unfolding includes the highest priority position (center frequency) in the time-transformed axis direction, only the signal point which has the highest priority is used for the reconstruction, while when the target of the unfolding does not include the highest priority position, only two signal points closest to the highest priority position (center frequency) in the time-transformed axis direction are used for the reconstruction. An example is described below in which Fourier transform is used as the transformation in the temporal axis direction.

Graphs 9a and 9b are schematic diagrams explaining how to select the signal points when Fourier transform is used. Each circle represents the signal points. The horizontal axis in each graph is the axis in the k direction while the vertical axis in each graph is the axis in the time-transformed axis direction. The filled circle is the signal point selected as the target of the unfolding while the open circle is the signal point to be eliminated from the target of the unfolding. The same determination criterion whether to eliminate the signal point is used for all the signal points with different positions in the k-axis direction.

The unfolding module 122b first determines whether the highest priority position in the time-transformed axis direction is the target of the unfolding. When the highest priority position in the time-transformed axis direction is the target of the unfolding, the unfolding module 122b selects the signal point whose position on the time-transformed axis is zero as the signal point used for reconstruction as illustrated in the graph 9a. When the signal point whose position on the time-transformed axis is zero is absent, the signal point whose position on the time-transformed axis is the nearest to zero is selected as the signal point used for reconstruction. In contrast, when the highest priority position in the time-transformed axis direction is not the target of the unfolding, the unfolding module 122b selects, as the appropriate signal points used for the reconstruction, two points closest to the highest priority position in the time-transformed axis direction, as illustrated in the graph 9b. When Fourier transform is used for the transformation in the temporal axis direction, due to the symmetry of Fourier transform, two points in total are expected to be chosen, in such a manner that one of them is selected from the positive highest priority position in the time-transformed axis, and the other is selected from the negative highest priority position in the time-transformed axis.

As for the fixed parameter, it is not necessary to use the parameters described above. When the modification is applied to the two-dimensional k-space data, the unfolding module 122b may select only the signal point of the central frequency in a case where the frequency f of the signal points includes the center frequency. Otherwise, the unfolding module 122b may select only m signal points closest to the center frequency, where m is a natural number, for example. In the second embodiment, Fourier transform is described in detail as the transformation from t into f. The transformation from t into f is not limited to the use of Fourier transform. As for the transformation from t into f, the various transformations described in the first embodiment such as the PCA can be used.

When the modification is applied to three-dimensional k-space data, the similar processing can be used. For example the following technique can be used. When the target of the unfolding includes the center frequency in the time-transformed axis direction or the expected signal intensity includes a maximum component, only the signal point corresponding to the center frequency in the time-transformed axis direction may be used for reconstruction. When the target of the unfolding does not include the center frequency in the time-transformed axis direction, only the signal points corresponding to the two frequencies closest to the highest priority position in the time-transformed axis direction may be used for reconstruction (or the two signal points with the highest expected signal intensity may be used for reconstruction). Because the undersampling is performed in two directions in the three-dimensional k-space, the parameters can be set in the same manner as the two-dimensional k-space data, except for the fact that the number of signal points corresponding to the respective frequencies is plural.

The fixed parameter is not limited to the parameter described above. Any parameter that is determined in advance can be used. For example, the following technique can be used. In the case where the modification is applied to the two-dimensional k-space data, when the target of the unfolding includes the highest priority position in the time-transformed axis direction, only the signal point with the highest priority position may be used for reconstruction. When the target of the unfolding does not include the highest priority position in the time-transformed axis direction, only three signal points closest to the center frequency may be used for reconstruction. In this case, the simple processing depending only on the time-transformed axis can be performed as the signal elimination processing.

As described above, the second embodiment can relatively further reduce the number of operations in the image reconstruction compared to the first embodiment while the image quality is improved.

Other Embodiments

The first and the second embodiments are presented by way of examples. The embodiments can be implemented in other various forms.

In the first embodiment, for determining whether to eliminate the signal from the target of the unfolding, the technique is described in which the SNR when the signal point is eliminated and the SNR when the signal point is not eliminated are compared with each other. The embodiment is not limited to this technique. The unfolding module 122b may perform the determination by taking various factors other than the SNR into consideration. For example, the unfolding module 122b may perform the determination in a comprehensive manner by taking an expected calculation cost into consideration. Various definitions and calculation techniques are available for the SNR, the signal intensity, the noise intensity, and the additional noise intensity. The calculation may be performed by a different calculation technique and may use different definitions from those in the above described embodiments. The unfolding module 122b may perform the signal elimination determination on a certain channel and thereafter apply the result of the signal elimination determination to all the other channels having the same position in the respective x-f spaces.

The unfolding module 122b may use a technique other than the comparison of the SNRs when determining whether to eliminate the signal point from the target of the unfolding. For example, a signal elimination criterion may be used in which the reconstruction error reduced by the elimination of the signal point exceeds a certain threshold and the reconstruction error increased by the elimination of the signal point does not exceed a certain threshold.

Image Processing Apparatus

In the embodiments, the MRI apparatus 100 serving as a medical image diagnostic apparatus performs the various types of processing. The embodiments are not limited to the MRI apparatus 100. For example, instead of the MRI apparatus 100, an image processing apparatus or an image processing system including the MRI apparatus 100 and an image processing apparatus may perform the various types of processing described above. Examples of the image processing apparatus include a work station, an image storage apparatus (image server) and a viewer using a picture archiving and communication system (PACS), and an electronic health record system. In such a case, the image processing apparatus receives the k-space data collected by the MRI apparatus 100 from the MRI apparatus 100, from an image server through a network, or as an input by the operator through a recording medium, and then stores the received k-space data in a storage, for example. The image processing apparatus performs the various types of processing (e.g., the processing performed by the transformation module 122a, the unfolding module 122b, and the inverse transformation module 122c) on the k-space data stored in the storage.

Program

The instructions indicated in the processing procedure illustrated in the above-described embodiment can be executed based on a computer program that is software. A general-purpose computer system stores therein the computer program in advance, and by reading in the computer program, a similar effect as that by the MRI apparatus and the image processing apparatus in the above-described embodiment can be achieved. The instructions described in the above-described embodiment are recorded as a computer executable program in a magnetic disk (flexible disk, hard disk, and others), an optical disc (CD-ROM, CD-R, CD-RW, DVD-ROM, DVD±R, DVD±RW, and others), a semiconductor memory, or a recording medium similar to the foregoing. As long as it is a storage medium readable by the computer or an embedded system, the memory format thereof may be in any form. When the computer reads in the program from the recording medium and causes the CPU to execute, based on the program, the instructions described in the program, the similar operation as that of the MRI apparatus and the image processing apparatus in the above-described embodiment can be implemented. Naturally, when the computer acquires or reads in the program, the computer may acquire or read it via a network.

Furthermore, the operating system (OS) running on the computer based on the instructions of the program installed on the computer or the embedded system from the storage medium, database management software, or middleware (MW) such as a network may execute a part of the respective processing to implement the above-described embodiment.

Moreover, the storage medium is not limited to a medium independent of the computer or the embedded system, and also includes a storage medium in which a computer program transmitted via a local area network (LAN) or the Internet is downloaded and stored or temporarily stored.

The storage medium is not limited to a single medium, and the embodiment includes a situation in which the processing in the above-described embodiment is executed from a plurality of media, and thus the configuration of the medium may be in any configuration.

The computer or the embedded system in the embodiment is to execute the respective processing in the above-described embodiment based on the computer program stored in the storage medium, and may be of any configuration such as a device composed of a single device such as a personal computer or a micro-computer and a system in which a plurality of devices are connected via a network.

The computer in the embodiment is not limited to a personal computer, and includes an arithmetic processing unit, micro-computer, and others included in an information processing apparatus, and thus the computer is a generic term for the devices and apparatuses that can implement the functions in the embodiment by a computer program.

In accordance with the magnetic resonance imaging apparatus and the image processing apparatus in at least one of the embodiments described above, image quality can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus, comprising:
   MRI gantry components including static and gradient magnetic field generators, plural radio frequency (RF) coils associated with respectively corresponding plural MR signal channels, RF transmitter and receiver circuitry and at least one computer connected to controllably interface with said components and configured to effect
   collection of time-series k-space data (k-t space data) from a plurality of said channels while spatially changing an MR signal sampling position;
   generation of transformed x-f space data of the respective channels by applying, to the k-t space data of the respective channels, Fourier transformation on a spatial axis and on a temporal axis;

eliminating some non-zero MR signal points from the transformed x-f space data based on a predetermined criterion that is separately evaluated for each MR signal point;

unfolding remaining transformed x-f space data on the respective channels using RF coil sensitivity distribution information for the respective channels to produce unfolded x-f space data; and inverse transforming the unfolded data on the temporal axis on which signal points have been eliminated to produce k-t space data.

2. The magnetic resonance imaging apparatus according to claim 1, wherein the predetermined criterion is an estimated evaluation value based upon a comparison between (a) an evaluation value obtained assuming that a signal point of interest is eliminated and (b) an evaluation value obtained assuming that the signal point of interest is not eliminated, and a signal point of interest is eliminated based on the comparison.

3. The magnetic resonance imaging apparatus according to claim 2, wherein the evaluation value is estimated signal to noise ratio (SNR).

4. The magnetic resonance imaging apparatus according to claim 3, wherein the estimated SNR is based on information learned from a plurality of pieces of data collected from a same object.

5. The magnetic resonance imaging apparatus according to claim 1, wherein the predetermined criterion for eliminating a signal point is based on values on a time-transformed axis in a transform space, the transform space being entered after the Fourier transform is applied to the k-space data on the spatial axis and the transformation is applied on the temporal axis, each of the values being values assigned to positions on the time-transformed axis.

6. The magnetic resonance imaging apparatus according to claim 5, wherein,
  (i) when a highest or lowest value is not assigned to a signal point that is to be an eliminated target signal point, all signal points other than that target signal point are eliminated and
  (ii) when a highest or lowest value is assigned to a signal point that is to be eliminated, at least two other signal points are selected and all signal points except the at least two other signal points are eliminated, the at least two other signal points including either (a) a signal point of a highest value and a signal point of a second highest value, or (b) a signal point of a lowest value and a signal point of a second lowest value.

7. An MR (magnetic resonance) image processing apparatus, comprising:
  a transformation module that obtains transformed x-f space data of respective MR RF coil channels by applying, to time series k-space data of the respective channels collected by spatially changing a sampling position, Fourier transformation on a spatial axis and on a temporal axis;
  an unfolding module that eliminates a non-zero MR signal point from the transformed x-f space data based on a predetermined criterion that is separately evaluated for each MR signal point; and that performs unfolding remaining transformed x-f space data on the respective channels to produce unfolded x-f space data using (a) the transformed space data on the respective channels and (b) RF coil sensitivity distribution information for the respective channels; and
  an inverse transformation module that applies inverse transformation of the unfolded data on the temporal axis on which the signal point has been eliminated.

* * * * *